United States Patent
Zhou et al.

(10) Patent No.: US 9,765,257 B2
(45) Date of Patent: Sep. 19, 2017

(54) EMISSIVE COMPACTS AND METHOD OF MAKING THE SAME

(71) Applicant: Nitto Denko Corporation, Osaka (JP)

(72) Inventors: Jiadong Zhou, San Diego, CA (US); Guang Pan, Carlsbad, CA (US); Hironaka Fujii, Carlsbad, CA (US); Bin Zhang, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 348 days.

(21) Appl. No.: 14/384,271

(22) PCT Filed: Mar. 12, 2013

(86) PCT No.: PCT/US2013/030539
§ 371 (c)(1),
(2) Date: Sep. 10, 2014

(87) PCT Pub. No.: WO2013/138347
PCT Pub. Date: Sep. 19, 2013

(65) Prior Publication Data
US 2015/0076406 A1    Mar. 19, 2015

Related U.S. Application Data

(60) Provisional application No. 61/609,750, filed on Mar. 12, 2012.

(51) Int. Cl.
| | | |
|---|---|---|
| *C09K 11/81* | (2006.01) | |
| *C09K 11/61* | (2006.01) | |
| *C09K 11/57* | (2006.01) | |
| *H01L 33/50* | (2010.01) | |
| *C04B 111/80* | (2006.01) | |

(52) U.S. Cl.
CPC .......... *C09K 11/616* (2013.01); *C09K 11/576* (2013.01); *H01L 33/502* (2013.01); *C04B 2111/807* (2013.01); *C04B 2235/65* (2013.01); *C04B 2235/66* (2013.01)

(58) Field of Classification Search
CPC ............ C04B 2235/65; C04B 2235/66; C04B 2111/807; C09K 11/57; C09K 11/617; C09K 11/61; C09K 11/616; H01L 33/502
See application file for complete search history.

(56) References Cited

U.S. PATENT DOCUMENTS

| 2006/0257659 A1 | 11/2006 | Hampden-Smith et al. |
| 2008/0191609 A1 | 8/2008 | Schmidt et al. |
| 2010/0207512 A1 | 8/2010 | Miyagawa et al. |
| 2012/0039064 A1* | 2/2012 | Ooyabu .............. H01L 33/507 362/84 |

\* cited by examiner

*Primary Examiner* — Carol M Koslow
(74) *Attorney, Agent, or Firm* — K&L Gates LLP; Louis C. Cullman; Robert W. Winn

(57) ABSTRACT

Some phosphor powders can be difficult to form into ceramic compacts because they are difficult to sinter. As described herein, phosphor powders that can degrade under conventional sintering temperatures can be sintered by heating the powder at a lower temperature, such as less than 800° C., while the powder is under greater than atmospheric pressure, such as at least 0.05 GPa. Phosphor ceramic compacts prepared by this method, and light-emitting devices incorporating these phosphor ceramic compacts, are also described.

14 Claims, 4 Drawing Sheets

T%<65%　　　　　　　　　T%>85%

EMISSIVE COMPACTS AND METHOD OF MAKING THE SAME

CROSS REFERENCE TO RELATED APPLICATIONS

This application is a national phase of PCT/US13/030539 filed on Mar. 12, 2013, which claims the benefit of U.S. Provisional Patent Application No. 61/609,750, filed Mar. 12, 2012, which is incorporated by reference herein in its entirety.

BACKGROUND

This disclosure relates to ceramic compacts of phosphor compositions, particularly phosphors for use in lighting applications and methods for making such ceramic compacts.

Some white light-emitting devices comprise a blue LED combined with yellow phosphor such as YAG:Ce, TAG:Ce, or Silicate etc. For backlighting of LCD display purpose, in order to obtain a display with high color reproducibility, a bright red phosphor can be helpful to compensate for the red deficiency in the white light generated by these conventional phosphor systems. For lighting purpose, a red phosphor is can also help to produce warm white light with high color rendering index. But a good red phosphor is difficult to obtain because an increasing Stokes shift can lead to a low quantum yield. Phosphor powders such as $K_2SiF_6:Mn^{4+}$ and $K_2TiF_6:Mn^{4+}$ are red emitters, but they tend to be unstable.

SUMMARY

Preparing a ceramic, such as a phosphor ceramic compact, from a powder can help to stabilize the material of the powder by reducing exposure to moisture, air, etc. Unfortunately, some unstable materials, such as some phosphor powders, can also be difficult to sinter because they can melt, sublime, or decompose at temperatures below those normally used for sintering. For some ceramic precursors, such as phosphor powders, this difficulty can be overcome by sintering at lower than conventional temperatures while applying elevated pressure, such as greater than atmospheric pressure.

Some embodiments include a method of sintering a ceramic, comprising heating a ceramic precursor, such as a phosphor powder, to a temperature lower than a temperature conventionally used for sintering, such as less than about 800° C., wherein the heating is done under greater than atmospheric pressure.

Some embodiments include a method of sintering a ceramic, comprising heating a phosphor powder to a temperature less than about 800° C., wherein the heating is done under greater than atmospheric pressure.

Some embodiments include a phosphor ceramic compact prepared by a sintering method described herein.

Some embodiments include a phosphor ceramic compact comprising a phosphor ceramic composition having a degradation temperature of less than 800° C.

DETAILED DESCRIPTION

Figure 1A:
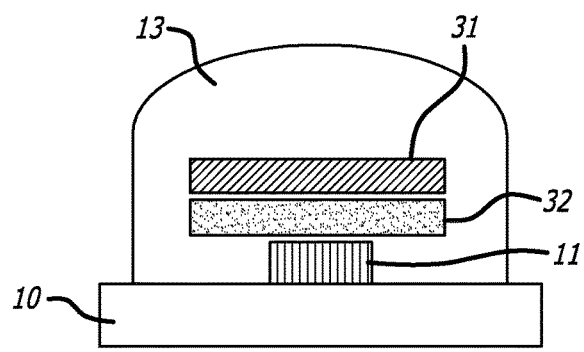
FIG. 1A is the side view of an embodiment of a white LED device with phosphor ceramic compact made in accordance with one embodiment of the invention.

Difficulty with sintering materials that degrade at low temperatures can be overcome for some ceramic precursors, such as phosphor powders, by sintering at lower than conventional temperatures while applying elevated pressure, such as greater than atmospheric pressure. Thus, a method comprising this type of sintering (referred to herein as "the sintering method") can allow ceramic materials, such as phosphor ceramic compacts, to be prepared more easily, or may allow ceramic materials (including phosphor ceramic compacts) to be prepared which previously could not be prepared.

One advantage of phosphor ceramic compacts over phosphor powders is that phosphor ceramic compacts can, under some circumstances, be more easily coated for improved durability. This may allow red phosphors, such as $K_2SiF_6$:Mn and $K_2TiF_6$:Mn, which degrade at relatively low temperatures, to be more readily used in light-emitting devices.

For convenience, the material that is used in the sintering method is referred to as a "phosphor powder," while material of the phosphor ceramic compact that is the product of the sintering method is referred to as a "phosphor ceramic composition." The phrase "the phosphor powder or a phosphor ceramic composition" is abbreviated herein by using the term "phosphor composition."

Generally, the sintering method involves heating a phosphor powder to a temperature that is less than a temperature used by a conventional sintering method. For example, a phosphor powder may be heated to a temperature less than about 800° C., about 700° C., about 650° C., about 600° C., about 550° C., or about 500° C.; and/or greater than about 75° C., about 150° C., about 175° C., or about 185° C. Typical heating temperatures could be in a range of about 75° C. to about 800° C., about 100° C. to about 500° C., about 150° C. to about 750° C., about 150° C. to about 500° C., about 175° C. to about 500° C., about 100° C. to about 300° C., or about 200° C. In some embodiments, a phosphor powder may be heated to a temperature that is at least about 100° C., about 150° C., about 200° C., about 250° C., or about 300° C. lower than the melting temperature or a decomposition temperature of the phosphor powder or a component of the phosphor powder.

Generally, the sintering method involves heating the phosphor powder under pressure, such as greater than atmospheric pressure. Very high pressures may be helpful to significantly reduce the temperature needed for adequate sintering. For example, useful pressures may be at least about 0.05 GPa, about 0.25 GPa, about 0.5 GPa, about 1 GPa; and/or up to about 2 GPa, about 5 GPa to about 10 GPa or about 100 GPa; including about 0.05 GPa to about 20 GPa, about 0.25 GPa to about 10 GPa, about 0.5 GPa to about 5 GPa, about 0.5 GPa to about 10 GPa, about 1 GPa to about 2 GPa, about 1.5 GPa; or any pressure in a range bounded by, or between, any of these values. In some embodiments, the phosphor powder is heated at a temperature of about 150° C. to about 750° C. under a pressure of about 0.05 GPa to about 20 GPa. In some embodiments, a lower pressure may be applied initially and then increased after a period of time. For example, a lower pressure may be applied until the sample achieves a uniform or target temperature, and then a higher pressure may be applied.

In some embodiments, the sintering method is carried out under conditions, such as heat and pressure, that maintains the chemical viability of the material of the phosphor powder.

Transparency of a ceramic phosphor compact prepared by the sintering method may be improved, in some circumstances, by starting with a phosphor powder having an appropriate size range. Very small particles can be difficult to sinter because the large surface area can be associated with a higher energy required for sintering. On the other hand, very large particles may not pack as well when compressed, and thus may be more difficult to sinter. For some phosphor powders, transparency, may be improved when average particle size is about 1 µm to about 100 µm, about 3 µm to about 100 µm, about 3 µm to about 75 µm, about 5 µm to about 60 µm, about 5 µm to about 50 µm, about 10 µm to about 50 µm, about 5 µm, about 25 µm, about 50 µm, or any average particle size in a range bounded by, or between, any of these values. In some embodiments, particularly for potassium hexafluorosilicate, an average particle size of about 10 µm to about 50 µm, may be used to obtain a phosphor ceramic compact that is substantially transparent or translucent. In some embodiments, at least about 50%, about 80%, about 90%, about 95%, or about 99% of the particles in the phosphor powder have a particle size of about 1 µm to about 100 µm, about 3 µm to about 100 µm, about 3 µm to about 75 µm, about 5 µm to about 60 µm, about 5 µm to about 50 µm, about 10 µm to about 50 µm, about 5 µm, about 25 µm, about 50 µm, or any particle size in a range bounded by, or between, any of these values. Particle size can be determined conventional methodology, such as dynamic light scattering, particle size analyzers, scanning electron microscopy, etc.

Some embodiments include forming a layer, such as a substantially level layer, of phosphor powder (such as any phosphor powder described herein) having an average particle size, or at least about 50% of the particles, from about 3 µm to about 75 µm, and heating the layer of phosphor powder at an elevated temperature, including a temperature in any range recited herein, while simultaneously applying pressure, including a pressure in any range recited herein, to form a substantially translucent phosphor ceramic compact.

There are a number of ways that particle size can be controlled so that the phosphor powder has the desired particle size, such as wafer etching or re-crystallization.

Wafer etching can involve chemically removing particles from the surface of a silicon wafer. One useful wafer etching method is described by Adachi (2008, Journal of Applied Physics 104: 023512-1). One example of a wafer etching method includes degreasing a silicon wafer using a standard method, and chemically etching the silicon wafer at room temperature in an aqueous etchant comprising $KMnO_4$ and HF. The desired end product, e.g., $K_2SiF_6$ will accumulate at the bottom of the container and can be removed for use. Particles generated by one of these wafer etching methods can have an average size of about 10 µm to about 250 µm, or about 100 µm.

Re-crystallization methods can include dissolving solid precursors and recrystallizing the desired phosphor particles under selected environmental conditions. In some embodiments, $K_2SiF_6$ (which is a commercial product) and $K_2MnF_6$ (which can be prepared as described herein) are dissolved in HF according to the desired $Mn^{4+}$ doping ratio in $K_2SiF_6$: $Mn^{4+}$, such as a $K_2SiF_6$:$KMnF_6$ weight ratio of about 2:1 to about 100:1, about 40:1 to about 4:1, or about 8:1. For this particular method, HF is used because the phosphor materials contain $F^-$.

Recrystallization methods include creating a supersaturated solution so that the desired phosphor material can precipitate out the supersaturated solution. The super-saturated state is achieved by methods such as evaporation of a solvent such as HF, addition of a poor solvent (solvent crash), cooling, etc. A product, such as $K_2SiF_6$:$Mn^{4+}$, can then recrystallize out of the super-saturated solution. The particular method can be chosen to produce particles in a desired size range.

In some embodiments, an intermediate is prepared for use in a recrystallization method. In some embodiments, $K_2MnF_6$ is produced according to published method (1953 Angew. Chem. 65: 304).

Re-crystallization by evaporation can produce particles having a size of about 200 µm to about 1 mm. In some embodiments, the supersaturated solution of $K_2SiF_6$ and $K_2MnF_6$ dissolved in HF is obtained by evaporation of the HF solvent. This may be accomplished by heating a desired ratio $K_2SiF_6$ and $K_2MnF_6$ dissolved in HF, and allowing the HF to evaporate. The $K_2SiF_6$:$Mn^{4+}$ produced in this manner can have a size of about 200 um to about 500 um.

Solvent crash with fast solvent addition, such as about 50 mL/min to about 200 mL/min, can give small particles, such as particles having a size of about 300 nm to 1 µm. Slower crash with slower solvent addition, such as about 2 mL/min to about 20 mL/min, can provide larger particles, such as particles having a size of about 2 µm to about 5 µm.

An example of solvent crash includes a miscible solvent (for example acetone, methanol, ethanol, and acetonitrile) to a solution of $K_2SiF_6$ and $K_2MnF_6$ dissolved in HF to yield a supersaturated solution. A miscible solvent that is poor solvent for potassium hexafluorosilicate helps to create a supersaturated solution so that $K_2SiF_6$:$Mn^{4+}$ crystals can be formed. The $K_2SiF_6$:$Mn^{4+}$ produced this way can have a size between about 200 nm and about 5 µm.

Re-crystallization by cooling with stirring can produce particles, such as potassium hexafluorosilicate particles, of 30 µm in size. Re-crystallization by cooling without stirring can produce particles, such as potassium hexafluorosilicate particles, in the 100 µm size range.

In some embodiments, a solution of $K_2SiF_6$ and $K_2MnF_6$ dissolved in HF is heated. Heating may help to enhance Mn doping into a $K_2SiF_6$ matrix. The solution is then cooled in an ice bath to precipitate out the solid product. The $K_2SiF_6$:$Mn^{4+}$ produced this way typically has a size of about 30 µm to about 100 µm.

In some embodiments, the phosphor powder may comprise a substantially level layer of phosphor particles. A substantially level layer of phosphor particles can be achieved by using a substantially planar surface, such as the pressing surface of a press, to apply pressure, or force to a layer of phosphor particles.

Some sintering methods employ a 13 mm die set (such as a dye set available from International Crystal Laboratories, Garfield, N.J., USA). For example, an anvil may be inserted into the die opening. The phosphor powder can then be inserted into the die above the anvil. The plunger may then be inserted into the die opening that is opposite the opening into which the anvil was inserted. The plunger, which can be about the same diameter as the die opening, can be inserted so that it lightly contacts the phosphor powder. The plunger can then be rotated against the phosphor powder surface so that the surface of the phosphor powder is substantially level prior to heating and/or applying pressure to the phosphor powder.

The sintering method can be used to prepare ceramic phosphor compacts using phosphor powders that are difficult or impossible to sinter at conventional temperatures. Thus, the sintering method is particularly suited to use on, or to produce, phosphor compositions having a low degradation temperature. Degradation temperature includes decomposition, melting temperature, or sublimation temperature. Decomposition temperature includes a temperature at which a chemical composition's chemical bonds are broken in the presence of heat, and differs from compound to compound. Some decomposition processes may include the release of gases such as $O_2$, $N_2$, $SiF_4$, $F_2$, $Cl_2$, HF, HCl, etc. Decomposition temperature may be determined by various methods such as thermal gravimetric analysis, differential scanning calorimetry, differential thermal analysis, etc. $K_2SiF_6$ has a decomposition temperature of about 550° C.

Melting temperature includes the temperature at which a solid and a liquid phase of a substance are at equilibrium. Sublimation temperature includes the temperature at which a solid and a gas phase of a substance are at equilibrium. Sublimation temperature or melting temperature may also be determined by various methods such as differential scanning calorimetry, etc. $K_2TiF_6$ as a melting temperature of about 780° C.

In some embodiments, the sintering method is used on, or to prepare, a phosphor composition having a sublimation temperature, melting temperature, or a decomposition temperature of less than about 800° C., about 700° C., about 650° C., about 600° C., about 550° C., or about 500° C. In some embodiments, a phosphor composition has a sublimation temperature, a melting temperature, or a decomposition temperature of at least about 20° C., at least about 50° C., or at least about 100° C. In some embodiments, a phosphor composition has a degradation temperature of less than 800° C.

The sintering method may be particularly suited to use on, or to prepare, phosphor compositions containing fluoride ($F^-$), as fluoride compounds can have low degradation temperatures. In some embodiments, a phosphor composition comprises: (A) $A_2[MF_6]:Mn^{4+}$, wherein A is Li, Na, K, Rb, Cs, $NH_4$, or a combination thereof; and wherein M is Ge, Si, Sn, Ti, Zr, or a combination thereof; (B) $E[MF_6]:Mn^{4+}$, wherein E is Mg, Ca, Sr, Ba, Zn, or a combination thereof; and wherein M is Ge, Si, Sn, Ti, Zr, or a combination thereof; (C) $Ba_{0.65}Zr_{0.35}F_{2.70}:Mn^{4+}$; or (D) $A_3[ZrF_7]:Mn^{4+}$, wherein A is Li, Na, K, Rb, Cs, $NH_4$, or a combination thereof.

In some embodiments, the phosphor composition comprises a doped potassium hexafluorosilicate, such as $K_2[SiF_6]:Mn^{4+}$, or a doped a potassium hexafluorotitanate, such as $K_2[TiF_6]:Mn^{4+}$.

Some phosphor compositions may be $Mn^{4+}$ activated. $Mn^{4+}$ activated phosphor powders can include $K_2[SiF_6]:Mn^{4+}$; $K_2[TiF_6]:Mn^{4+}$; $K_3[ZrF_7]:Mn^{4+}$; $Ba_{0.65}Zr_{0.35}F_{2.70}:Mn^{4+}$; $Ba[TiF_6]:Mn^{4+}$; $K_2[SnF_6]:Mn^{4+}$; $Na_2[TiF_6]:Mn^{4+}$; or $Na_2[ZrF_6]:Mn^{4+}$. The sintering method may be particularly useful with, or to prepare, phosphor compositions comprising complex fluoride phosphors doped with $Mn^{4+}$ with a coordination number of 6 for the coordination center (i.e. in a generally octahedral environment, as in $K_2[TiF_6]:Mn^{4+}$ and $K_2[SiF_6]:Mn^{4+}$). Other complex fluorides with higher coordination numbers for the central ion (e.g. $K_3[ZrF_7]$ with a coordination number of 7) are also applicable as host lattices for activation with Me. In some embodiments, the phosphor composition is $K_2TiF_6:Mn$. In some embodiments, the phosphor composition is $K_2SiF_6:SiF_6:Mn$. In some embodiments, the phosphor composition is $K_2[SiF_6]:Mn^{4+}$.

Some embodiments include a phosphor ceramic compact prepared by a process comprising the sintering method.

A phosphor ceramic compact may be substantially translucent, meaning that at least some light can pass through the compact. Some phosphor ceramic compacts may have a transmittance of at least about 10%, at least about 50%, at least about 60%, at least about 70%, at least about 80%, least about 85%, at least about 90%, at least about 95%, about 10% to 100%, about 10% to nearly 100%, or any transmittance in a range bounded by, or between, any of these values. Transparency or translucency can be adjusted as needed or desired for a particular applications or circumstances, by adjusting conditions of the sintering method, or by adjusting internal scattering using voids or other kinds of scattering sources.

Once a phosphor powder is sintered, the resultant compact may be coated. Coating can help to prevent the phosphor ceramic from being degraded by exposure to moisture, air, etc. Thus, a phosphor ceramic compact may further include a coating. The coating can be disposed on an exterior surface of a phosphor ceramic compact. Some useful coatings can include poly(p-xylylene) or an analog thereof, nitrides, and/or metal oxides, e.g., $Al_2O_3$. In some embodiments, a coating comprising optionally substituted poly(p-xylylene), e.g. poly(p-xylylene), poly(chloro-p-xylylene), poly(bromo-p-xylylene), etc., is disposed upon an exterior surface of a phosphor ceramic compact. The phosphor ceramic compact may be coated with the coating material using conventional coating approaches for substrate coating, such as chemical vapor deposition. Any suitable coating thickness may be used. For example, may be desirable for a coating to be thick enough to provide moisture resistance. On the other hand, it may be desirable to have a coating that is not so thick that cost and handling are problematic. In some embodiments, a coating may have a thickness of about 1 μm to about 100 μm, about 5 μm to about 50 μm, about 10 μm to about 20 μm, or about 15 μm. In some embodiments, an optionally substituted poly(p-xylylene) coating on a phosphor ceramic compact, such as a phosphor ceramic compact comprising a doped or and undoped potassium hexafluorosilicate or potassium hexafluorotitanate, may be about 15 μm.

A coating may help to improve durability of a phosphor ceramic compact. One way to test durability of a phosphor ceramic compact many to expose the compact to 85° C. and 85% relative humidity, and determine the efficiency after the exposure after a designated period of time. For example, efficiency may be tested after exposure for about 1 hour, about 12 hours, about 24 hours, about 48 hours, about 72 hours, etc.

Methods of coating a phosphor ceramic compact can include sol-gel, chemical vapor deposition (CVD), plasma-enhance CVD (PE-CVD), atomic layer deposition (ALD), etc. One method of carrying out CVD is described in J. Phys. D: Appl. Phys. 2001, 34:740. One method of carrying out PECVD is described in J. Vac. Sci. Technol. A, 1998, 16:3190. Examples of suitable coating materials include $Al_2O_3$, poly(p-xylylene) polymers, including poly(p-xylylene) polymers sold under the trade name PARYLENE C® [poly(chloro-p-xylylene)] and PARYLENE N® [unsubstituted poly(p-xylylene)], $Si_3N_4$, and others.

Some phosphor ceramic compacts may be substantially free of binder material. In some embodiments, a phosphor ceramic compact may contain less than about 10% binder, less than about 5% binder, less than about 3% binder, less than about 1% binder, or less than about 0.5% binder, either in weight % or molar or atomic weight %.

A phosphor ceramic compact may be incorporated into an emissive layer of a light-emitting diode, or be used as a color conversion component to modify the color of light emitted from an emissive layer. For example, a phosphor ceramic compact positioned in a device so that light emitted from an emissive layer passes through the phosphor ceramic compact before being released from the light-emitting device. Some of the light that enters into the phosphor ceramic compact can be absorbed by the phosphor screen and re-emitted as light of a longer, or more red, wavelength. Thus, a phosphor ceramic compact can be used as a color conversion in a light-emitting device by converting light emitted from an emissive layer to light of a longer wavelength.

Some embodiments comprise a semiconductor light-emitting device comprising: a light-emitting layer disposed between an n-type region and the p-type region and a phosphor ceramic compact disposed or positioned in a path of light emitted by the light-layer. Thus, the device is configured so that the phosphor ceramic compact can convert color of some of the light from the light-emitting layer to light of a longer wavelength. In some embodiments, the semiconductor light-emitting device is attached to a host substrate, and the phosphor ceramic compact is attached to a surface of the semiconductor light-emitting device opposite the host substrate.

In some embodiments, a light-emitting device that includes a phosphor ceramic compact as a color conversion component may be a white light-emitting device. Such a device may use a base light-emitting device or light-emitting diode that emits light having a natural peak wavelength. In some embodiments, the natural peak wavelength can be about 440 nm to about 470 nm. Light of the natural peak wavelength can be at least partially absorbed by the phosphor ceramic compact and be emitted at a modified peak wavelength, which can be longer than the natural peak wavelength. The portion of the light from the base light-emitting device or light-emitting diode that is not converted by the phosphor ceramic compact can combine with light converted from the phosphor ceramic compact to form light of a modified color. The light converted may also be ultraviolet light that is converted to light in the visible range. The overall appearance of the modified color may be any color desired, such as blue, green, yellow, orange, or red. In some embodiments, a light-emitting device incorporating a phosphor ceramic compact as a color conversion component emits white light as a result of color conversion.

An example of a light-emitting device that uses a phosphor ceramic compact as a color conversion component is illustrated in FIG. 1A. As shown in FIG. 1A, conventional base light-emitting diode (LED) 11 is mounted on a submount 10. Phosphor ceramic compact 31 and phosphor ceramic compact 32 are disposed over base light-emitting diode 11, and encapsulant resin 13 covers the entire device.

In some embodiments, base LED 11 may be a blue LED or a blue-light emitting LED. A portion of the blue light emitted from the blue LED is absorbed by phosphor ceramic compact 31 and phosphor ceramic compact 32, which then emit light with a different wavelength, such as yellow light by phosphor ceramic compact 31, and red light by phosphor ceramic compact 32. Part of blue light emitted by LED 11 passes through the phosphor ceramic plates without being absorbed. Consequently, blue light, yellow light and red light are emitted from the LED, and the human eye perceives that synthesized or mixed light as white light. The size of the phosphor ceramic compact 31 and ceramic compact 32 may match the size of the blue LED 11 or may be larger than the size of the blue LED 11. In some embodiments, the white color balance may be controlled by changing the coverage ratio of the phosphor ceramic compact 31/phosphor ceramic compact 32 (i.e., color changing medium) over the size of blue LED 11. In some embodiments, the size of phosphor ceramic compact 14 may be smaller than the size of blue LED 11. Color balance, including white color balance, may also be controlled by varying the thickness of phosphor ceramic compact 31 or phosphor ceramic compact 32. A thicker phosphor ceramic compact can convert more light, and thus the amount of light converted can be controlled by adjusting the thickness of the phosphor ceramic compact. In some embodiments, the phosphor ceramic compact can have a thickness of about 0.1 mm to about 50 mm. In some embodiments, the phosphor ceramic compact can have a thickness of about 0.5 mm to about 10 mm. In some embodiments, the phosphor ceramic compact can have a thickness of about 1.0 mm to about 5 mm.

In an embodiment, the phosphor ceramic compact comprises a doped garnet material, e.g, yttrium aluminum garnet ($Y_2Al_5O_{12}$) doped with cerium. Other useful sintering materials are described in U.S. Publication 2009-0212697, published Aug. 27, 2009, filed Feb. 19, 2009, Ser. No. 12/389,207, which is incorporated by reference in its entirety. A blue LED is typically formed by using an AlInGaN based single crystal semiconductor material. In a device such as the one depicted in FIG. 1A, base LED 11 is electrically connected and mounted on submount 10. LED 11 may be capable of emitting blue light, such as light with a peak wavelength of about 440 nm to about 470 nm.

In some embodiments, LED 11 may emit ultraviolet light, such as a light with a peak wavelength of about 350 nm to about 410 nm.

The phosphor ceramic compact 31 and phosphor ceramic compact 32 may be placed and/or fixed over the blue LED 11 using encapsulant resin 13, specific adhesive, or a mechanical holder. The encapsulant resin 13 and adhesive may include any of silicone, epoxy, low-melting-point-glass, transparent adhesives, or other materials. In embodiments where UV LED 30 is used instead of blue LED 11, use of a thermally and/or UV-durable material like silicone and low-melting-point glass may be desirable, particularly under conditions where epoxy, or another material that has light absorption in the wavelength region of UV light emitted from the LED, can be degraded. In addition, it may also be helpful to use a thermally and UV-durable material like silicone and low-melting-point glass if the LED is driven at a very high operating temperature. For LEDs that are driven at high operating temperatures, the close proximity of a hot LED surface to an adhesive can also cause adhesive to be degraded. Powder LEDs are examples of devices that may be driven at high operating temperatures.

Figure 1B:
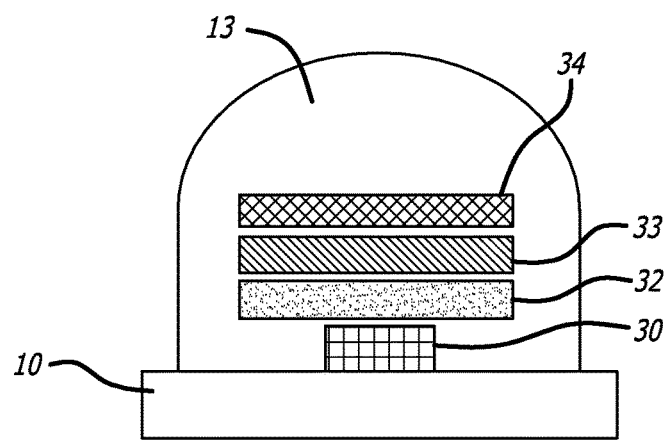
FIG. 1B shows an embodiment of a white LED device.

Different color combinations of the base LED and phosphor materials may be used to meet particular color needs. In some embodiments, two or more phosphor ceramic compacts of different phosphors having different emission peak wavelengths can be stacked together over the blue LED 11 or the UV LED 30. In other embodiments, green and red emitting phosphor ceramic compact combination may also be used. In some embodiments, the combination of UV LED 30 with red ceramic phosphor compact 32, green ceramic phosphor compact 33, and blue phosphor ceramic compact 34 as shown in FIG. 1B. In some embodiments, the red, green and blue emissive materials can be a powder system driven by UV LED 30.

Typically, a phosphor ceramic compact is a flat plate. However, a phosphor ceramic compact may be any shape, such as dome shaped, a capped shape, a container shape, etc., depending upon circumstances under which the phosphor ceramic compact is used, and/or the optical design of device. The position of a phosphor ceramic compact may also vary depending upon the circumstances.

The following embodiments are specifically contemplated herein:

Embodiment 1

A method of sintering a ceramic, comprising heating a phosphor powder to a temperature less than about 800° C., wherein the heating is done under greater than atmospheric pressure.

Embodiment 2

The method of embodiment 1, wherein the phosphor powder is heated at a temperature of about 150° C. to about 750° C.

Embodiment 3

The method of embodiment 1, wherein the phosphor powder is heated at a temperature of about 175° C. to about 500° C.

Embodiment 4

The method of any preceding embodiment, wherein the phosphor powder is heated at a pressure of at least 0.05 GPa.

Embodiment 5

The method of embodiment 4, wherein the phosphor powder is heated at a pressure of about 0.05 GPa to about 20 GPa.

Embodiment 6

The method of embodiment 4, wherein the phosphor powder is heated at a pressure of about 0.5 GPa to about 10 GPa.

Embodiment 7

The method of any preceding embodiment, wherein the phosphor powder has an average particle size of 1 μm to 100 μm.

Embodiment 8

The method of any preceding embodiment, wherein the phosphor powder has an average particle size of about 3 μm to about 75 μm.

Embodiment 9

The method of any preceding embodiment, wherein the phosphor powder comprises a substantially level layer of phosphor particles.

Embodiment 10

The method of any preceding embodiment, wherein the phosphor powder comprises fluoride.

Embodiment 11

The method of embodiment 10, wherein the phosphor powder comprises:
(A) $A_2[MF_6]:Mn^{4+}$, wherein A is Li, Na, K, Rb, Cs, NH$_4$, or a combination thereof; and wherein M is Ge, Si, Sn, Ti, Zr, or a combination thereof;
(B) $E[MF_6]:Mn^{4+}$, wherein E is Mg, Ca, Sr, Ba, Zn, or a combination thereof; and wherein M is Ge, Si, Sn, Ti, Zr, or a combination thereof;
(C) $Ba_{0.65}Zr_{0.35}F_{2.70}:Mn^{4+}$; or
(D) $A_3[ZrF_7]:Mn^{4+}$, wherein A is Li, Na, K, Rb, Cs, NH$_4$, or a combination thereof.

Embodiment 12

The method of any preceding embodiment, wherein the phosphor powder comprises a potassium hexafluorosilicate.

Embodiment 13

The method of any preceding embodiment, wherein the phosphor powder comprises a potassium hexafluorotitanate.

Embodiment 14

The method of any preceding embodiment, wherein the phosphor powder comprises $K_2TiF_6$ or $K_2SiF_6$.

Embodiment 15

A phosphor ceramic compact prepared by a method of any preceding embodiment.

Embodiment 16

A phosphor ceramic compact comprising a phosphor ceramic composition having a degradation temperature of less than 800° C.

Embodiment 17

The phosphor ceramic compact of embodiment 16, wherein the phosphor ceramic composition has a degradation temperature of at least 20° C.

Example 1

Particle Synthesis

KMnO$_4$ (99%, Sigma Aldrich), HF (48-51%, BDH), and Silicon wafer of either n- or p-type are used in a wafer etching method. KHF$_2$ (99%, Sigma Aldrich), H$_2$O$_2$ (30%, Sigma Aldrich), KMnO$_4$, and HF are used in synthesizing K$_2$MnF$_6$. K$_2$MnF$_6$, K$_2$SiF$_6$ (99%, Alfa Aesar), and HF are used in most re-crystallization based synthesis.

Figure 1C:
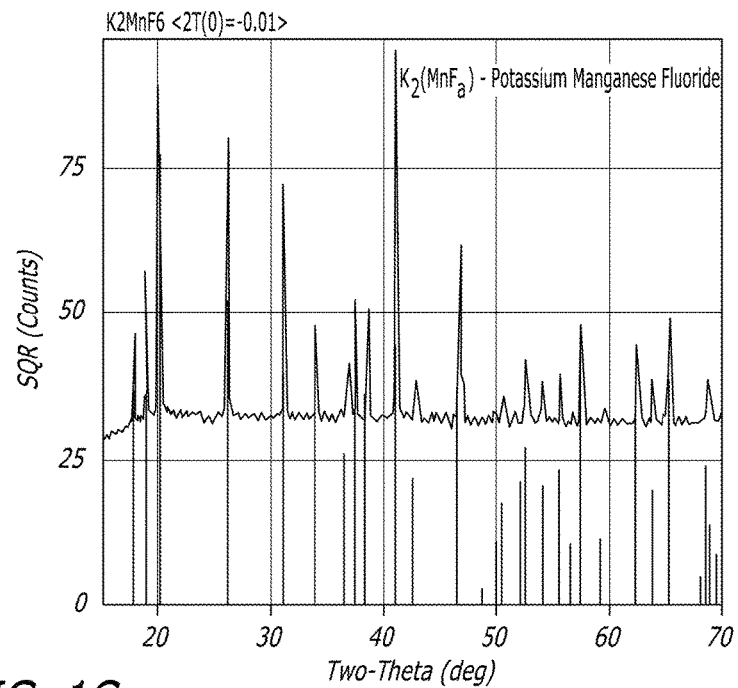
FIG. 1C illustrates an XRD spectrum depicting peaks corresponding to $K_2MnF_6$.

$K_2MnF_6$ was made according to published method (1953 Angew. Chem. 65: 304). $KHF_2$ (30 g, 99%, Sigma Aldrich) and $KMnO_4$ (1.5 g, 99%, Sigma Aldrich) were dissolved in 100 mL of 40% HF (48-51%, BDH) in an ice water bath with stir. 30% $H_2O_2$ was added to the above solution drop-wise, until the color of the solution changed from deep purple to brown. The precipitate was filtered through grade 515 filter paper (Ahlstrom), washed with Acetone, and then dried in air. FIG. 1C shows XRD analysis of the synthesized $K_2MnF_6$ by using the above described process, and it confirms the existence of the preferred $K_2MnF_6$ phase. The average particle diameter ($D_{avg}$) was obtained from examination of the SEM images.

For solvent crash method, $K_2MnF_6$, $K_2SiF_6$ (99%, Alfa Aesar, Ward Hill, Mass., USA), and HF were used. The solvent used for crashing is inter-miscible with HF water solution, and is a solvent in which potassium hexafluorosilicate (PHFS) is stable and has much lower solubility than in high-concentration HF. Examples of such solvents include: acetone, ethanol, methanol, and acetonitrile.

1A. Wafer Etching

Either n- or p-type (100) oriented Si wafers with resistivity of 0.002-20 Ocm were used. The wafers were cleaned in the manner of Werner Kern (W. Kern, RCA Review, 31, 1970).

Figure 2:
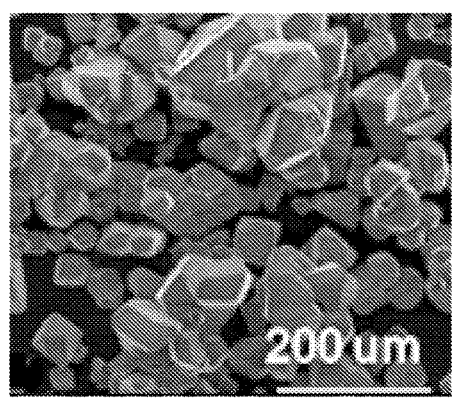
FIG. 2 illustrates an SEM image of potassium hexafluorosilicate (PHFS) particles obtained by wafer etching method.

The cleaned wafer (2 g) was then placed in 100 mL of 4% potassium permangante ($KMnO_4$) (Sigma-Aldrich, St. Louis, Mo.) and 32% hydrofluoric acid (HF) (Sigma-Aldrich, St. Louis, Mo.) at room temperature for about 3 hours in a teflon container. PHFS was accumulated at the bottom of the Teflon container, and was filtered through grade 515 filter paper (Ahlstrom), washed with Acetone, and then dried in air. PHFS particles obtained this way typically had size of 100 μm. A representative SEM image of the synthesize powder is shown in FIG. 2.

Figure 3:
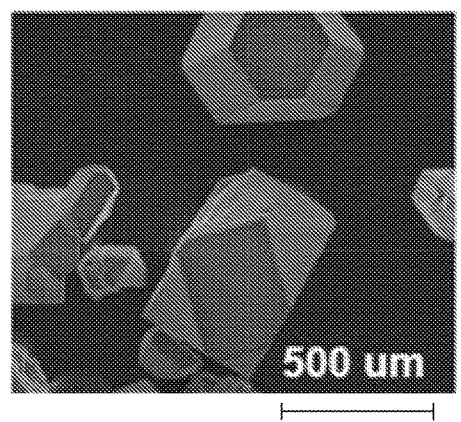
FIG. 3 illustrates an SEM image of PHFS particles obtained through re-crystallization by evaporating HF.

1B. Re-Crystallization by Evaporation of HF $K_2SiF_6$ (1 g) and $K_2MnF_6$ (0.125 g) are dissolved in 30 mL of 48% HF in a 100 mL Teflon beaker. The solution was heated in a water bath at about 90° C. for 30 minutes with stirring (300 rpm). Heating is continued without stirring until all liquid is evaporated, whereas the PHFS phosphor is left behind. The product is washed with Acetone and dried in air. About 1 g of PHFS with average particle sizes in the range of 200-500 μm were obtained. A representative SEM image of the synthesize powder is shown in FIG. 3.

Figure 4:
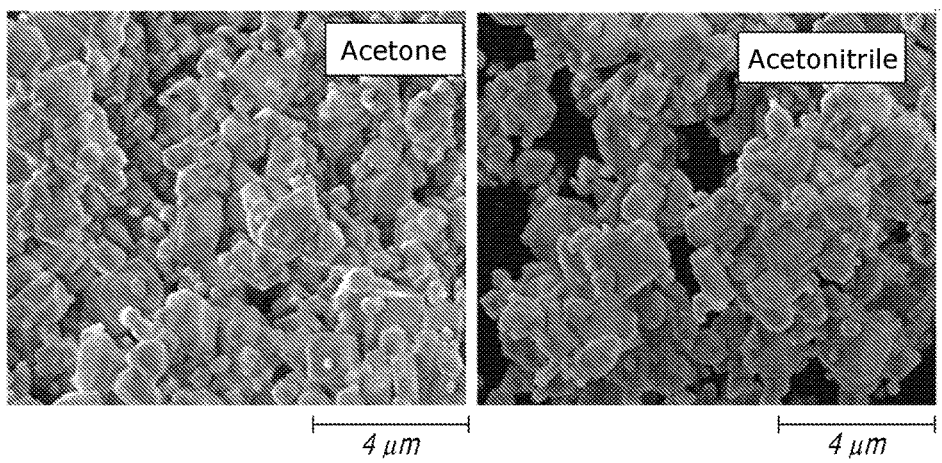
FIG. 4 illustrates SEM images of PHFS particles obtained through re-crystallization by adding acetone, acetonitrile, methanol, and ethanol.
Figure 4:
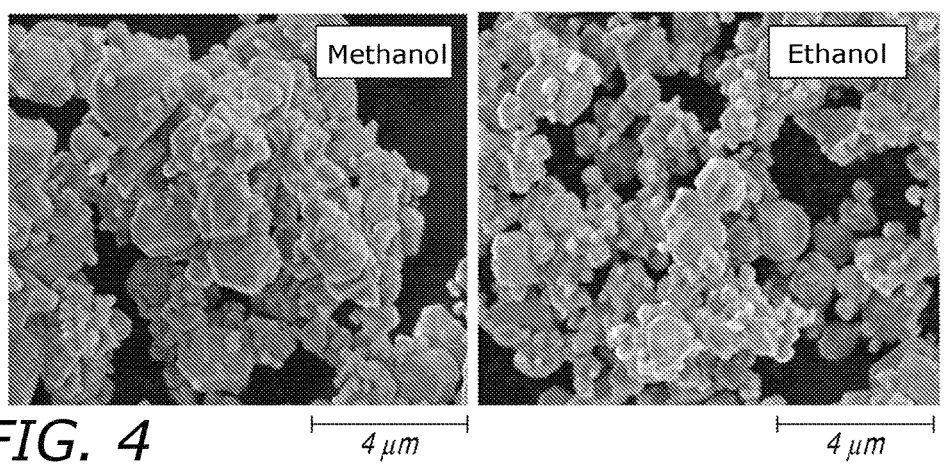

1C. Re-Crystallization by Solvent Crash $K_2SiF_6$ (1 g) and $K_2MnF_6$ (0.125 g) are dissolved in 40 mL of 48% HF in a 250 mL Teflon beaker at room temperature. Acetone (100 mL) at a rate of 100 mL/minute was added to the solution with stirring (300 rpm). The product was filtered through grade 515 filter paper (Ahlstrom), washed with copious amounts of acetone, and dried in air. About 1 g of $K_2SiF_6$ was synthesized by this method. The example was repeated except for substituting the same amount of acetonitrile, methanol and ethanol were used for acetone. SEM images of the synthesize powder with different solvents are shown in FIG. 4.

Figure 5:
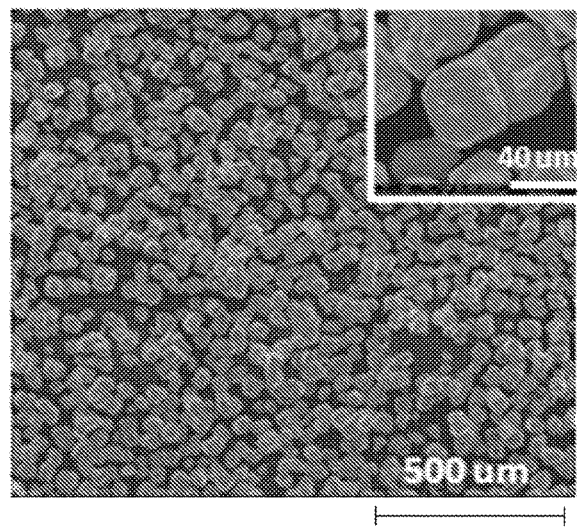
FIG. 5 illustrates SEM images of PHFS particles obtained though re-crystallization by cooling.

1D. Re-Crystallization by Cooling of Super-Saturated Solution $K_2SiF_6$ (1 g) and $K_2MnF_6$ (0.125 g) are dissolved in 20 mL of 48% HF in a 100 mL Teflon beaker. The solution is heated at elevated temperature (90 C) for 20 minutes with stirring (300 rpm). It is then cooled down in ice bath, with stirring (300 rpm). The product removed from the ice bath and was filtered through grade 515 filter paper (Ahlstrom), washed with acetone, and dried in air. About 0.4 g of material was synthesized according to this method. Stirring led to an average particle size of about 30 μm size. The example was repeated except for not stirring while heating the solution. Without stirring, the average particle size was about 100 μm. An SEM image of the synthesized powders is shown in FIG. 5.

1E. Cleaning of PHFS Phosphor Particles

Prior to pressing, the so formed phosphor particles were cleaned by the following. To a 10 g sample, 50 ml of 0.1 M $Na_2SO_3$ were added, mixed, and centrifuged. 50 ml of 1M HCL was added to resuspend the pellet, and centrifuged again. The pellet was frozen in dry ice/Acetone bath, and dried under 0.02 mBar vacuum at −80 C.

Translucent Compact Formation

PHFS (150 mg) was weighed and put in a 13 mm steel die (International Crystal Laboratories, Garfield, N.J.). The die was then loaded onto a pre-heated hydraulic press (Uni-axial Hot Press, Model TBH-100H, Sansho Industry, Osaka, JP) pre-heated to about 200 C., A 50 kN force was applied for 5 minutes, followed by a 150 kN force for another 5 minutes.

These phosphor ceramic compact samples were positioned in front of a white light source. Total light transmittance data of the samples were measured by using the measurement system similar to that described in U.S. Patent Publication No. 2009-0212697, published Aug. 27, 2099, Ser. No. 12/389,207, filed Feb. 19, 2009 (MCPD 7000, Otsuka Electronics, Inc, Xe lamp, monochromator, and integrating sphere equipped). Table 1 shows the T % (light transmittance) at 800 nm of the samples.

The substantially translucent phosphor ceramic compact with reasonable mechanical strength and outlook was obtained by using the above described synthesis methods. The flexibility of particle size control of the above mentioned synthesis allowed a translucent phosphor ceramic compact of an acceptable quality to be obtained. In addition, it is anticipated that a phosphor ceramic compact of an acceptable quality can be obtained in a wider temperature and pressure range besides the above described operation conditions. Table 1 shows example of the prepared PHFS phosphor ceramic compacts with different temperature and pressure, and their resulted compact performance.

Figure 6:
FIG. 6 illustrates a photograph of PHFS compacts formed using a process described in the examples.

FIG. 6 shows the images of PHFS compacts (3 μm/200 C/150 kN; <65%; and 25 μm/200 C/150 kN; <85%) formed by the above described process (<65% transparency and >85% transparency).

TABLE 1

$K_2SiF_6$:$Mn^{4+}$ (PHFS) compact under different conditions

| Powder average particle size | Temperature | Pressure (for 13 mm compact size) | Transparency |
|---|---|---|---|
| 0.7 μm | 200 C. | 150 kN | <60% |
| 3 μm | 200 C. | 150 kN | <65% |
| 5 μm | 200 C. | 150 kN | >85% |
| 25 μm | 25 C. | 150 kN | Less than 5% |
| 25 μm | 200 C. | 150 kN | >85% |
| 25 μm | 600 C. | 150 kN | melted |
| 50 μm | 200 C. | 150 kN | >85% |
| 100 μm | 200 C. | 150 kN | <40% |

Coating PHFS Compact

Many coating materials and methods are available for coating a compact with transparent moisture barriers. These include: Parylene with CVD, $Al_2O_3$ with ALD or sol-gel, and nitrides with PECVD. It is anticipated that a coated compact with a 15 um Parylene C coating will exhibit higher tolerance to moisture than uncoated controls.

Durability Testing

Durability of a sample was tested by incubating the sample in a chamber with an ambient of 85° C. and 85% relative humidity (85° C./85% RH). Want to efficiency was measured at different time points to it changed over time in this environment. A slower change typically exemplified higher durability.

Figure 7:
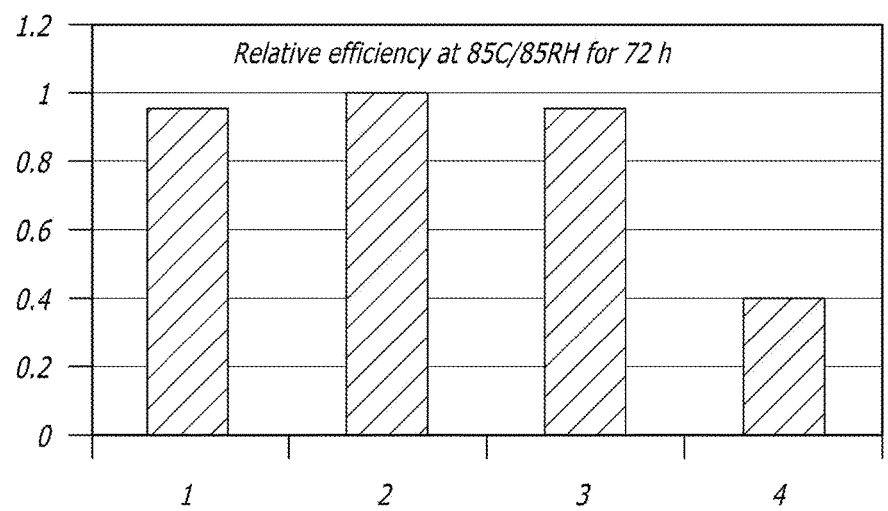
FIG. 7 illustrates the relative efficiency of different PHFS compacts after a durability test at 85 C/85 RH for 72 hours.

FIG. 7 shows the durability test of both $K_2SiF_6$:$Mn^{4+}$ (PHFS) powder and formed compact by using the above mentioned processes. The samples used for the test are summarized in Table 2. It indicated that although more transparent compacts may have greater durability than less transparent compacts (<65% or >85%), a coated compact showed greatly enhanced durability compared with the PHFS powders.

TABLE 2 powder vs. coated compact for durability comparison test

|   |   | powder size used |
|---|---|---|
| 1 | coated compact with T % <60% | 3 |
| 2 | coated compact with T % >85% | 25 |
| 3 | coated compact with T % <40% | 100 |
| 4 | powders (3 um in size) | 3 |

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A method of sintering a ceramic, comprising heating a phosphor powder to a temperature less than the degradation temperature of the phosphor powder, wherein the degradation temperature is less than about 800° C., and wherein the heating is done under greater than atmospheric pressure.

2. The method of claim 1, wherein the phosphor powder is heated at a temperature of about 150° C. to about 750° C.

3. The method of claim 1, wherein the phosphor powder is heated at a temperature of about 175° C. to about 500° C.

4. The method of claim 1, wherein the phosphor powder is heated at a pressure of at least 0.05 GPa.

5. The method of claim 4, wherein the phosphor powder is heated at a pressure of about 0.05 GPa to about 20 GPa.

6. The method of claim 4, wherein the phosphor powder is heated at a pressure of about 0.5 GPa to about 10 GPa.

7. The method of claim 1, wherein the phosphor powder has an average particle size of 1 μm to 100 μm.

8. The method of claim 1, wherein the phosphor powder has an average particle size of about 3 μm to about 75 μm.

9. The method of claim 1, wherein the phosphor powder comprises a substantially level layer of phosphor particles.

10. The method of claim 1, wherein the phosphor powder comprises fluoride.

11. The method of claim 10, wherein the phosphor powder comprises:
   (A) $A_2[MF_6]$:$Mn^{4+}$, wherein A is Li, Na, K, Rb, Cs, $NH_4$, or a combination thereof; and wherein M is Ge, Si, Sn, Ti, Zr, or a combination thereof;
   (B) $E[MF_6]$:$Mn^{4+}$, wherein E is Mg, Ca, Sr, Ba, Zn, or a combination thereof; and wherein M is Ge, Si, Sn, Ti, Zr, or a combination thereof;
   (C) $Ba_{0.65}Zr_{0.35}F_{2.70}$:$Mn^{4+}$; or
   (D) $A_3[ZrF_7]$:$Mn^{4+}$, wherein A is Li, Na, K, Rb, Cs, $NH_4$, or a combination thereof.

12. The method of claim 1, wherein the phosphor powder comprises a potassium hexafluorosilicate and a dopant.

13. The method of claim 1, wherein the phosphor powder comprises a potassium hexafluorotitanate and a dopant.

14. The method of claim 1, wherein the phosphor powder comprises $K_2TiF_6$:Mn or $K_2SiF_6$:Mn.

* * * * *